(12) United States Patent
Iyer et al.

(10) Patent No.: US 6,340,615 B1
(45) Date of Patent: Jan. 22, 2002

(54) METHOD OF FORMING A TRENCH CAPACITOR DRAM CELL

(75) Inventors: Sundar K. Iyer, Beacon; Rama Divakaruni, Middletown; Herbert L. Ho, New Windsor; Subramanian Iyer, Mount Kisco; Babar A. Khan, Ossining, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/466,605

(22) Filed: Dec. 17, 1999

(51) Int. Cl.$^7$ .......................... H01L 21/8242
(52) U.S. Cl. ...................... 438/248; 438/524
(58) Field of Search ................ 438/243, 244, 438/246, 247, 248, 387, 390, 391, 524

(56) References Cited

U.S. PATENT DOCUMENTS 5,827,765 A * 10/1998 Stengl et al. ............... 438/248
5,895,255 A * 4/1999 Tsuchiaki .................. 438/427
6,211,006 B1 * 4/2001 Tsai et al. .................. 438/246

* cited by examiner

Primary Examiner—Chandra Chaudhari
(74) Attorney, Agent, or Firm—Eric W. Petraske

(57) ABSTRACT

A method of connecting a trench capacitor in a dynamic random access memory (DRAM) cell. First, trenches are formed in a silicon substrate using a masking layer including a pad nitride layer on a pad oxide layer. Trench capacitors are formed in the trenches. A buried strap is formed in each trench on the capacitor. The nitride pad layer is pulled back from the trench openings, exposing the pad oxide layer and any strap material that may have replaced the pad oxide layer around the trenches. The straps and trench sidewalls are doped to form a resistive connection. During a subsequent shallow trench isolation (STI) process, which involves an oxidation step, the exposed strap material on the surface of the silicon surface layer forms oxide unrestrained by pad nitride without stressing the silicon substrate.

6 Claims, 4 Drawing Sheets

METHOD OF FORMING A TRENCH CAPACITOR DRAM CELL

BACKGROUND OF THE INVENTION

1. Field of the Invention

The present invention generally relates to semiconductor memories and, more particularly, to methods of connecting a storage capacitor plate to a pass transistor conducting terminal in dynamic random access memory cells.

2. Background Description

Dynamic Random Access Memory (DRAM) cells are well known. A DRAM cell is essentially a capacitor for storing charge coupled to a pass transistor (also called a pass gate or access transistor) for transferring charge to and from the capacitor. The absence or presence of charge on the capacitor corresponds to a logic value of data stored in the cell. Because cell size determines chip density, size and cost, reducing cell area is one of the DRAM designer's primary goals.

Reducing cell area is done, normally, by shrinking feature sizes to shrink the cell. In addition to shrinking the cell features, the most effective way to reduce cell area is to reduce the largest feature in the cell, typically, the area of the storage capacitor. Unfortunately, shrinking the capacitor area reduces capacitance and, consequently, reduces stored charge. Reduced charge means that what is stored in the DRAM cell is more susceptible to noise, soft errors, leakage and other well known DRAM problems.

Also, each cell is read by coupling the cell's storage capacitor (through the access transistor) to a bitline, which is a larger capacitance, and measuring the resulting voltage difference on the bit line. So, since the voltage difference is proportional to the two capacitances, reducing the cell storable capacitance reduces the voltage difference. Consequently, another DRAM cell designer's goal is to maintain storage capacitance, thereby maximizing stored charge without sacrificing cell area.

One way to reduce DRAM cell size without necessarily reducing storage capacitance is to use trench capacitors in the cells. Typically, trench capacitors are formed by etching long deep trenches in a silicon wafer, selectively doping the trench sidewalls, coating the trench with a dielectric layer. Then, the coated trench is filled with polysilicon or amorphous silicon to form a vertical cell capacitor plate and, as a result, a cell capacitor on its side in the trench. Thus, the silicon surface "real estate" required for the storage capacitor is dramatically reduced without sacrificing capacitance.

The typical bit line signal is a few hundred millivolts (mV) that develops asymptotically from the time that the access transistor is turned on as a function of the series resistance between the two capacitances. To achieve high performance, state of the art sense amplifiers must sense a voltage difference that is something less than the final signal value of a few hundred millivolts. Any resistance between the bitline and the storage capacitor of the cell being read increases the collective signal path RC and, as a result, increases the time required to develop a sufficient bit line signal, large enough to sense.

For state of the art trench capacitor DRAM cells, the plate is strapped to the access transistor's source diffusion, typically, with doped polysilicon or doped amorphous silicon. The doped strap forms a pn junction that acts as, or merges with the source diffusion junction. The strap, which may be buried beneath the chip surface and connects the deep trench capacitor to the access transistor, forms a resistive connection, ideally with very low resistance.

However, strap resistance may be high enough to cause concern for DRAM cell designers. The resistance of the strap itself, the resistance of the contacts between the strap and the plates or the resistance of the source diffusion, may be high enough to slow down cell read access beyond an acceptable range and, to a lesser extent, may also slow down writing to the cell. If all cells are affected, the read and write timing might be adjusted to compensate for the additional delay; if individual cells are affected, the affected cells will appear as individual failures. However, regardless of how the problem exhibits itself, high resistance straps reduce DRAM yield when too may cells fail or when overall access time becomes excessively long.

One known approach to reducing strap resistance is to implant dopant impurities at an angle to the trench sidewalls prior to forming the straps, thereby doping the area to which the buried strap is contacted. Implanting trench sidewalls at an angle requires rotating the wafers at least twice during implantation (180° rotations, one for each trench sidewall) to dope all buried strap contact areas appropriately. However, this two direction approach restricts the cell active area orientation, layout and design rules. Here, the active area refers to the silicon surface area on which the access transistor and bit line contact are located and isolated with shallow trench isolation. The orientation restrictions may be overcome by rotating the wafer four or more times with, for example, 90 degrees for each rotation. Unfortunately, to avoid affecting device active area adjacent to the trenches, ion implant energy and angle of implant must be limited for this four way rotation. Although these process changes help reduce buried strap resistance, they result in increased process complexity, raise chip cost and impede wafer throughput, besides restricting cell active area.

Thus there is a need for a simple way to form low resistance strap connections for trench capacitor DRAM cells.

SUMMARY OF THE INVENTION

It is therefore a purpose of the present invention to decrease the Dynamic Random Access Memory (DRAM) cell access;

It is another purpose of the present invention to reduce resistance in DRAM cell storage capacitance connections;

It is yet another purpose of the present invention to reduce DRAM cell access time by reducing trench capacitor plate connection resistance.

The present invention is a method of connecting a trench capacitor in a dynamic random access memory (DRAM) cell. First, trenches are formed in a silicon substrate using a masking layer including a pad nitride layer on a pad oxide layer. Trench capacitors are formed in the trenches. A buried strap is formed in each trench on the capacitor. The nitride pad layer is pulled back from the trench openings, exposing the pad oxide layer and any strap material that may have replaced the pad oxide layer around trench openings. Then, the straps and trench sidewalls can be doped with a vertical implant to form a resistive connection reliably. Exposed strap material on the surface of the silicon surface layer forms oxide unrestrained by pad nitride without stressing the silicon substrate during the subsequent STI processing.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1A:
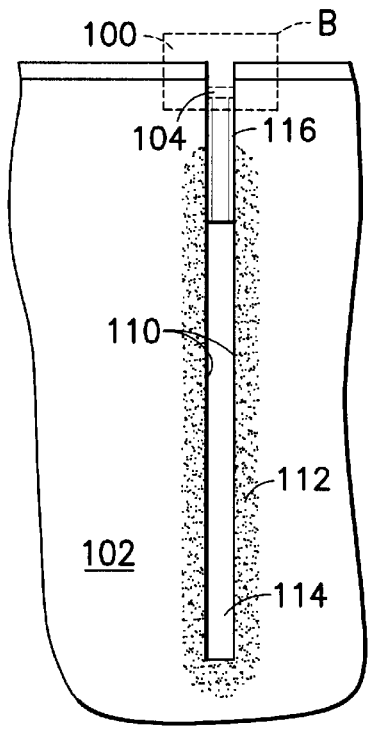
FIGS. 1A–B show a cross section of a buried trench cell having a buried strap formed according to the preferred embodiment of the present invention.
Figure 1B:
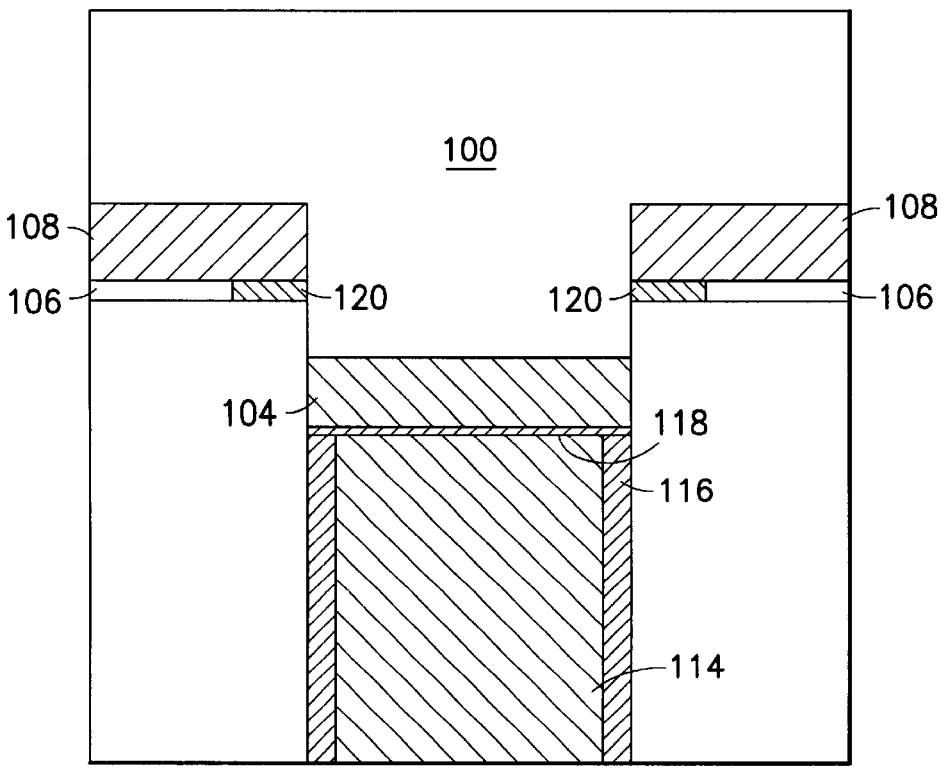

Referring now to the drawings, and more particularly, FIG. 1A shows a cross section of a buried trench cell capacitor formed in a trench 100 in a semiconductor body or substrate 102, preferably a silicon substrate, having a buried strap 104 formed according to the preferred embodiment of the present invention. FIG. 1B is an expanded view of area B of the cross section of FIG. 1A. A pad oxide layer 106 is formed on the silicon substrate. Then, a pad nitride layer 108 is formed on the pad oxide layer 106 to complete a masking layer. A deep trench pattern is formed in the pad nitride layer 108 and pad oxide layer 106 using a well known photolithographic technique. The trenches 100 are etched through the pattern into the silicon substrate 102 using a directional etch such as a reactive ion etch (RIE).

The trench sidewalls 110 are doped and dopant is diffused into the silicon substrate to form a first capacitor plate 112 which, typically, is tied to a common reference voltage. Using typical trench capacitor formation steps, the trench 100 is lined with capacitor dielectric (not shown) and then, filled with silicon, preferably doped amorphous silicon to form the other capacitor plate 114. Unless otherwise differentiated, "capacitor plate" is used hereinbelow to refer to silicon plate 114. To prevent leakage or formation of unwanted parasitic sidewall FETs, a dielectric collar 116, preferably of oxide, is formed at the upper part of the trench 100. Methods of forming the oxide collar 116 are well known. Initially, the oxide collar 116 extends from the pad nitride surface down into the trench. Then, the collar portion of the trench 100 is partially filled with silicon to extend the plate 114 above the capacitor region 112 of the trench 100, typically to a point at least 100 nm below the silicon surface. This extended portion provides a contact 118 to the plate 114 that is relatively isolated from the capacitor. Next, the oxide collar 116 is etched using a wet etch to remove that portion (not shown) of the collar 116 above the plate contact 118. Optionally, the collar 116 may be etched below the surface of the plate contact 118. Silicon, preferably amorphous silicon, is deposited in the trench 100 on the plate 114 to form strap 104.

When the oxide collar 116 is etched to the plate contact, the trench sidewalls are etched, slightly and, more importantly, the pad oxide layer 106 is etched laterally, unintentionally undercutting the pad nitride layer 108. When amorphous silicon material is deposited for the strap 104, the undercut is filled, inadvertently, with amorphous silicon 120. Ordinarily, this would not be considered a problem because as masking layers, both the pad nitride layer 108 and the underlying pad oxide layer 106, are removed after the masking layer is no longer needed. Normally, shallow isolation trenches are formed, filled with oxide and these masking layers 106, 108 are removed. However, after forming shallow trenches and before filling the shallow trenches with oxide, all exposed trench sidewalls, both shallow and deep, are oxidized to form a protective oxide layer (not shown) which may be followed by a conformal nitride layer.

When this protective oxide layer is formed, the inadvertently deposited amorphous silicon 120 in the undercut oxidizes rapidly, expanding as it oxidizes. Since the pad nitride 106 contains and inhibits upward expansion, the oxide formed by oxidizing the amorphous silicon 120 stresses the surface silicon at the lip of the trench, causing defects adjacent to the buried strap 104. These defects can cause increased cell leakage.

Figure 2A:
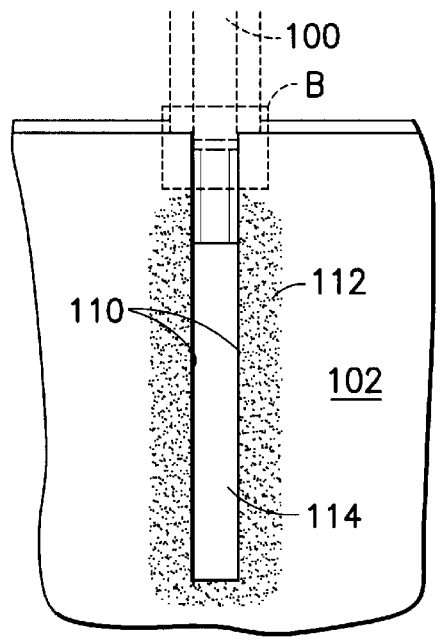
FIGS. 2A–B show a cross section of the buried trench cell of FIGS. 1A–B, wherein the pad nitride masking layer is pulled back from the edge of the trench after forming the amorphous silicon strap.
Figure 2B:
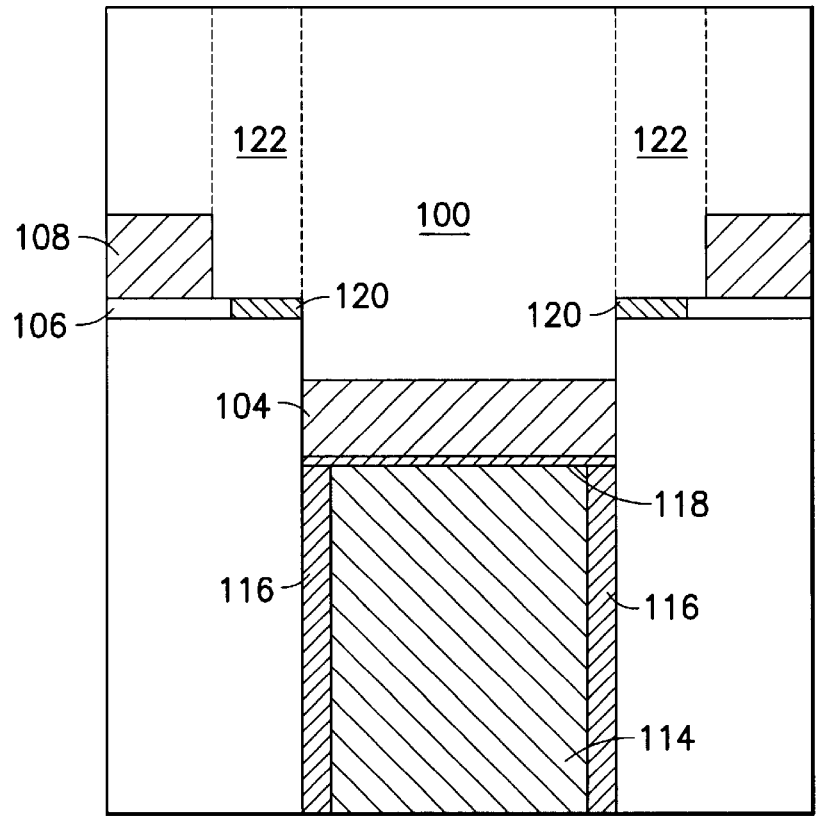

Thus, as is shown in the cross section of FIG. 2A, according to the preferred embodiment of the present invention, the pad nitride masking layer 108 is pulled back from the edge of the trench 100 after the forming the amorphous silicon strap 104. FIG. 2B is an expanded view of area B of the cross section of FIG. 2A. The wafer is immersed in a nitride etchant solution. The etchant solution uniformly etches the pad nitride layer 108 such that the nitride portions of the trench 100 pattern is expanded and the nitride layer, effectively, pulls back from the trenches 100, thereby defining a pull back region 122 and exposing the unwanted amorphous silicon 120 there.

Figure 3A:
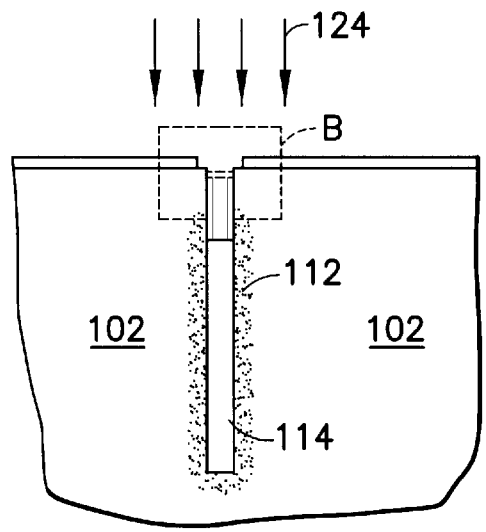
FIGS. 3A–B show the strap and the exposed area around the trench being implanted according to the preferred embodiment of the present invention.
Figure 3B:
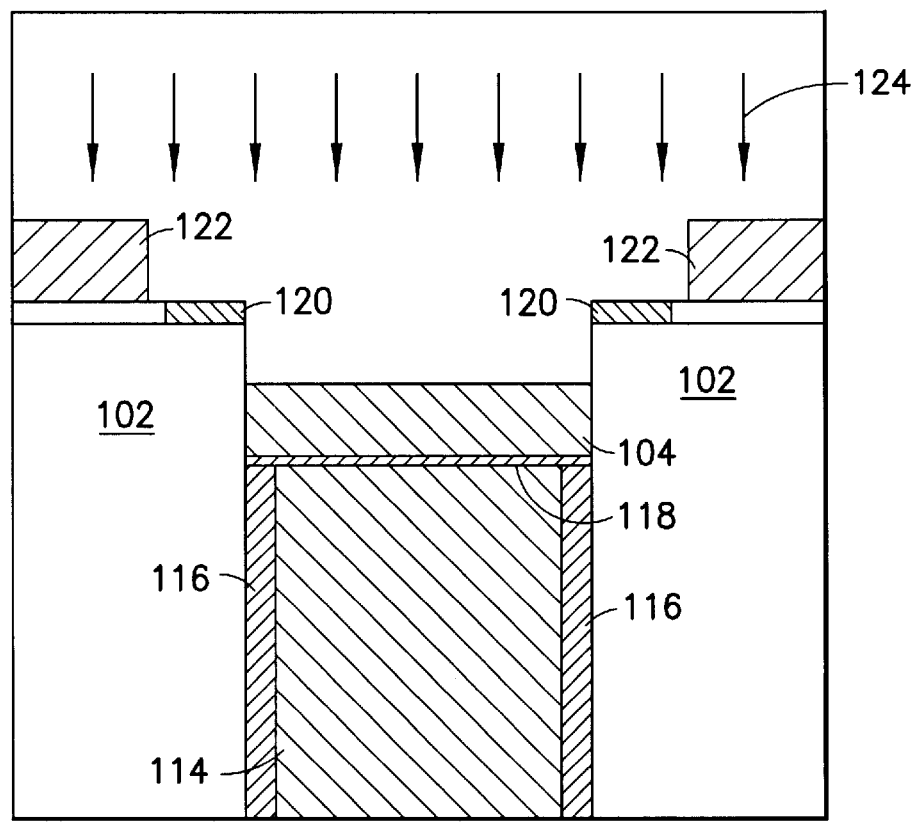

Then, in FIG. 3A the strap 104 and the exposed area in the pull back region 122 around the trench 100 are implanted as indicated by arrows 124. FIG. 3B is an expanded view of area B of the cross section of FIG. 3A. The nitride pad layer 108 prevents dopant from being implanted anywhere but in the trench 100 and in the surface at the pullback area 122 surrounding the trench 100. Further, by pulling the pad nitride 108 back from the edge of the trench, the angle of incidence for implanting the exposed trench sidewalls is reduced. While a single vertical implant as shown in FIGS. 3A–B is sufficient to dope both the strap 104 and the exposed silicon sidewalls, a two angle implant may be used to further improve the resistive sidewall strap contact. Also, when oxide is formed on the strap 104 and around the trench 100 top, the nitride masking layer 108 pull back allows the exposed amorphous silicon 120 to expand upward as it oxidizes without stressing the silicon surface below it. Having thus minimized stress, defects are reduced in the silicon lip of the trench 100 adjacent to the strap 104, thereby increasing DRAM yield.

After forming and doping the strap 104, shallow isolation trenches arte formed to pattern the active areas and the shallow trenches (not shown) are filled with oxide. Then, the pad nitride layer 108 and the underlying pad oxide layer 106 are removed and processing continues normally. DRAM cells are completed using suitable semiconductor manufacturing steps to form a transfer gate in or, adjacent to the trenches 100 with the buried strap 104 being resistively connected to the transfer gate. Further, bit lines and word lines are formed on the surface to complete the DRAM array formation.

Figure 4:
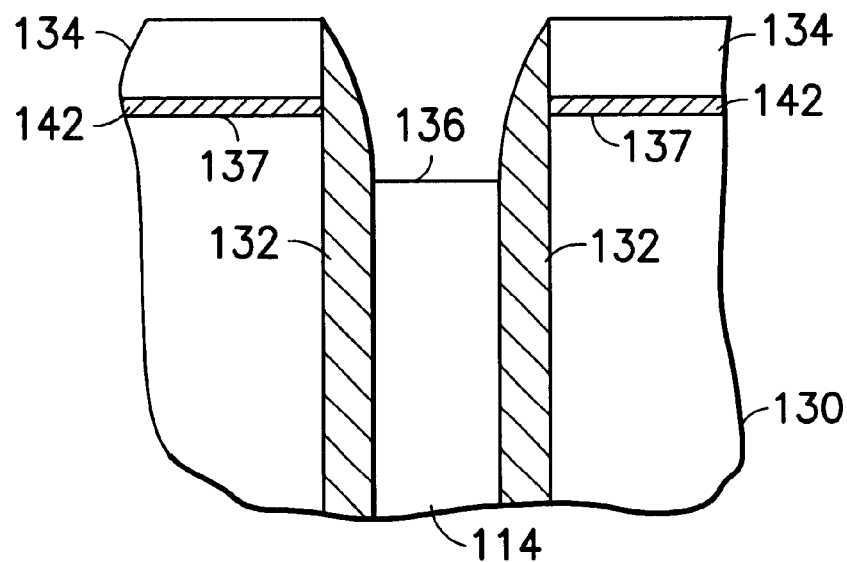
FIG. 4 shows a cross section of an alternative embodiment wherein the buried plate is etched shallower than that in the first preferred embodiment.

FIG. 4 shows a cross section of an alternative embodiment 130 wherein the plate 114 and the strap are polysilicon. Initially, the oxide collar 132 extends upward along the sides of pad nitride layer 134. In this embodiment, after forming the oxide collar 132, the trench is filled with polysilicon, which is then etched into the trench so that the upper surface 136 of the polysilicon plate 114 is below the silicon surface 137, typically about 50 nm as compared to 100 nm of the first embodiment. Accordingly, etch time for etching the plate 114 takes less time than the first preferred embodiment.

Figure 5:
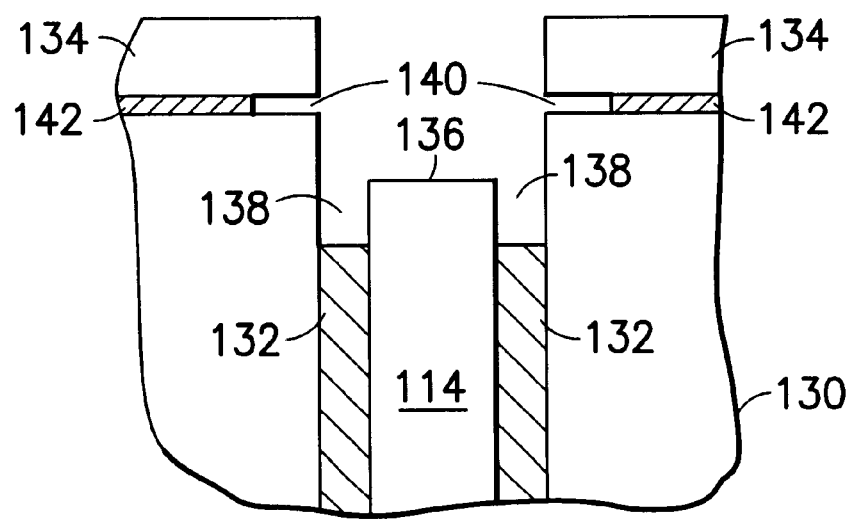
FIG. 5 shows the embodiment in FIG. 4 after using a wet etch to etch the collar below the upper surface of the plate.

In FIG. 5, the embodiment 130 of FIG. 4 is etched using a wet etch to etch the collar 132 from the sidewalls and below the upper surface 136 of the plate 114 forming recesses 138. Preferably, 50 nm recesses 138 form adjacent to the plate 114. As with the preferred embodiment, when the oxide collar 132 is etched, the pad oxide 142 also is etched, unintentionally, below and undercutting the pad nitride 134 forming gaps 140. When polysilicon is deposited to form buried straps in recesses 138 and above plate 114, the undercut gaps 140 are filled with buried strap polysilicon. For this second embodiment as with the first embodiment, the nitride layer 134 is pulled back, to completely expose the buried strap poly filling the undercuts gaps 140 and normal processing resumes, doping the polysilicon strap 104 and adjacent silicon sidewall as described for the preferred embodiment.

The advantage of this second embodiment is that it affords a shallower initial recess without compromising the buried strap resistance. Additionally, etch time to etch the polysilicon plate 50 nm into the trenches is shorter than the etch time for first embodiment etching the amorphous silicon plate 100 nm. This shorter etch time reduces the manufacturing process time. Also, the shallower strap will be beneficial as DRAM cell transistors shrink by reducing short channel effects.

While the invention has been described in terms of preferred embodiments, those skilled in the art will recognize that the invention can be practiced with modification within the spirit and scope of the appended claims.

We claim:

1. A method of forming a trench capacitor in a dynamic random access memory cell, comprising the steps of:
    a) forming a first trench pattern in a layered masking layer on a surface of a semiconductor body;
    b) etching a trench into said semiconductor body through said first trench pattern;
    c) forming a first capacitor plate disposed in said semiconductor body about said trench;
    d) forming a dielectric layer on inner surfaces of said trench;
    e) partially filling said trench with semiconductor material to form a capacitor plate within said trench;
    f) forming a dielectric collar in an upper portion of said trench;
    g) partially filling said dielectric collar with said semiconductor material;
    h) removing an upper portion of said dielectric collar above a top surface of said semiconductor material; and
    i) forming a strap disposed on said top surface of said semiconductor material; wherein the improvement comprises:
        (i) forming a second trench pattern disposed about and larger than said first trench pattern,
        (ii) etching an upper masking layer of said layered masking layer through said second trench pattern, stopping on a lower masking layer of said layered masking layer comprising substantially the same material as said dielectric collar, thereby exposing a pull back region of said substrate disposed about said trench and covered by said lower masking layer; and
        (iii) implanting said strap and said rim portion with a dopant.

2. A method according to claim 1, in which said dielectric collar and said lower masking layer are formed from oxide; and
    said upper masking layer is formed from nitride, whereby said step of removing said upper portion of said dielectric collar removes an abutting portion of said lower masking layer abutting said trench.

3. A method according to claim 2, in which said strap is formed from amorphous silicon, whereby amorphous silicon is deposited in an opening formed by removal of said abutting portion of said lower masking layer during said step of forming said strap.

4. A method according to claim 1, in which said step of implanting is performed at a non-zero angle with respect to a vertical axis, whereby dopants are implanted directly into said inner surfaces of said trench.

5. A method according to claim 2, in which said step of implanting is performed at a non-zero angle with respect to a vertical axis, whereby dopants are implanted directly into said inner surfaces of said trench.

6. A method according to claim 3, in which said step of implanting is performed at a non-zero angle with respect to a vertical axis, whereby dopants are implanted directly into said inner surfaces of said trench.

* * * * *